United States Patent
Gorisse et al.

(10) Patent No.: US 8,819,904 B2
(45) Date of Patent: Sep. 2, 2014

(54) PROCESS FOR PRODUCING AN ACOUSTIC DEVICE HAVING A CONTROLLED-BANDGAP PHONONIC CRYSTAL STRUCTURE

(75) Inventors: Marie Gorisse, Chauray (FR); Alexandre Reinhardt, Saint Martin d'Heres (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 65 days.

(21) Appl. No.: 13/371,192

(22) Filed: Feb. 10, 2012

(65) Prior Publication Data

US 2012/0204415 A1    Aug. 16, 2012

(30) Foreign Application Priority Data

Feb. 11, 2011   (FR) ...................................... 11 51101

(51) Int. Cl.
*H01L 41/22*   (2013.01)
(52) U.S. Cl.
USPC .............. 29/25.35; 29/592.1; 29/594; 29/595
(58) Field of Classification Search
USPC ............................... 29/25.35, 592.1, 594, 595
See application file for complete search history.

(56) References Cited

U.S. PATENT DOCUMENTS

| | | |
|---|---|---|
| 2009/0295505 A1 | 12/2009 | Mohammadi et al. |
| 2010/0327995 A1 | 12/2010 | Reinhardt et al. |
| 2011/0273243 A1 | 11/2011 | Domingue et al. |

OTHER PUBLICATIONS

1 GHZ Phononic Band Gap in Air/Aluminum Nitride for Symmetric Lamb Waves, Nai-Kuei Kuo et al (2011 IEEE 24th Intr't Conf. on Micro-Electronic Mechanical Systems (MEMS 2011), Jan. 23-27, 2011, pp. 740-743.*

Sarah Benchabane, "Guidage et Filtrage Desondes Dans Les Cristaux Phononiques", [Online] URL:membres. multimania.fr/sbenchabane/publications/Benchabane_these.pdf, Jan. 1, 2006, pp. 83-101, XP009152493.

Badreddine M. Assouar et al., "Phononic Crystals Based on LiNbO3 Realized Using Domain Inversion by Electron-Beam Irradiation", IEEE Transactions on Ultrasonics, Ferroelectrics and Frequency Control, Feb. 1, 2008, pp. 273-278, vol. 53, No. 2, IEEE, US, XP011225315.

J.O. Vasseur, et al., "Absolute Forbidden Bands and Waveguiding in Two-Dimensional Phononic Crystal Plates", Physical Review B, Feb. 1, 2008, vol. 77, No. 8, XP55007994.

M.S. Kushwaha, et al, "Acoustic Band Structure of Periodic Elastic Composites", Physical Review Letters, Sep. 27, 1993, pp. 2002-2025, vol. 71, No. 13, The American Physical Society.

(Continued)

*Primary Examiner* — Carl Arbes
(74) *Attorney, Agent, or Firm* — Baker & Hostetler LLP

(57) ABSTRACT

A process for producing an acoustic device having a phononic crystal structure comprising inclusions produced in a first medium distributed in a matrix of a second medium, to block propagation of acoustic waves within a bandgap frequency band, includes: defining geometric parameters of said inclusions, which have walls contacting said matrix, making at least one non-zero first wall angle, to the normal of the plane of said structure, said geometric parameters including said first wall angle; determining a function relating to variation in frequency position of said bandgap with said wall angle or relating to variation in width of said bandgap with said wall angle; determining said at least first angle, for a selected frequency position and/or selected width of the bandgap, from the function or functions determined beforehand; and producing said inclusions having at least said first wall angle in said matrix formed by said second medium.

19 Claims, 10 Drawing Sheets

(56) References Cited

OTHER PUBLICATIONS

S. Mohammadi, et al., "Complete Phononic Bandgaps and Bandgap Maps in Two-Dimensional Silicon Phononic Crystal Plates", Electronics Letters, Aug. 2, 2007, pp. 898-899, vol. 43, No. 16.

Naipkuei Kuo, et al, "Microscale Inverse Acoustic Band Gap Structure in Aluminum Nitride", Applied Physics Letters, Sep. 2009, vol. 95, No. 093501-1, American Institute of Physics.

Roy H. Olsson, III, et al, Microfabricated VHF Acoustic Crystals and Waveguides, Sensors and Actuators 145-146, Nov. 2008, pp. 87-93, Issue SI, Elsevier B.V.

Saeed Mohammadi, et al., "Evidence of Large High Frequency Complete Phononic Band Gaps in Silicon Phononic Crystal Plates", Applied Physics Letters, Jun. 2008, vol. 92, Issue 22, American Institute of Physics.

Nai-Kuei Kuo, et al., "Demonstration of Inverse Acoustic Band Gap Structures in AlN and Integration with Piezoelectric Contour Mode Wideband Transducers", Scholarly Commons (Univ. of PA), Department of Electrical & Systems Engineering, Apr. 1, 2009, 5 pages.

Y.M. Saliman, et al., "Phononic Crystals Operating in the Gigahertz Range with Extremely Wide Bands Gaps", Applied Physics Letters, 2010, vol. 97, 3 pages, American Institute of Physics.

W.E. Newell, "Face-Mounted Piezoelectric Resonators", Proceedings of the IEEE, 1965, pp. 575-581, vol. 53.

Marie Gorisse, et al., "Conception de Cristaux Phononiques 2D Dans une Membrane de Nitrure D'Aluminium", Journees Nationales du Reseau Doctoral en Microelectronique, Jun. 2010, 4 pages.

* cited by examiner

PROCESS FOR PRODUCING AN ACOUSTIC DEVICE HAVING A CONTROLLED-BANDGAP PHONONIC CRYSTAL STRUCTURE

CROSS-REFERENCE TO RELATED APPLICATION

This application claims priority to foreign French patent application No. FR 1151101, filed on Feb. 11, 2011, the disclosure of which is incorporated by reference in its entirety.

FIELD OF THE INVENTION

The field of the invention is that of acoustic devices that operate by propagation of acoustic waves being blocked by a generally periodic organization of acoustically different materials for the purpose of providing electrical filter functions.

BACKGROUND

The term "acoustic device" is understood to mean any structure using acoustic wave propagation and notably acoustic filters or resonators.

Such devices have operating frequencies that may range from a few Hz to a few GHz. The potential applications of these devices may be as acoustic lenses and RF filters, which may be used in wireless communication and notably in mobile telephony, or else as many anti-vibration or RF devices.

According to the known art, as described notably in the article by M. S. Kushwaha, P. Halevi, L. Dobrzynski and B. Djafari-Rouhani, *Acoustic Band Structure of Periodic Elastic Composites*, Physical Review Letters, Vol. 71 (13), pp. 2022-2025, 1993, phononic crystals are formed by a periodic organization of several, usually two, acoustically different materials. These systems have bandgaps, that is to say frequencies for which no acoustic wave can propagate. These organizations may be in one, two or three dimensions. In one dimension, they correspond to Bragg mirrors, as described in the article by W. E. Newell, *Face-mounted piezoelectric resonators*, Proceedings of the IEEE, Vol. 53, pp. 575-581, 1965, encountered notably in BAW (Bulk Acoustic Wave) resonators. These structures are widely used in the industry. Two-dimensional or three-dimensional structures are currently still in the research state.

According to the known art, these structures are generally produced by excavating holes in a material, as illustrated in FIG. 1 (a corresponding to the periodicity of the features, h to their height and d to their diameter), and sometimes by partially or completely filling them with another material. The holes produced tend to be as cylindrical as possible, but it is well known that it is not technologically possible to produce perfect cylinders. In fact, the holes tend to be conical. Sarah Benchabane's thesis "Guidage et filtrage des ondes dans les cristaux phononiques [*Wave guiding and filtering in phononic crystals*]", U.F.R. des Sciences et Techniques de l'Université de Franche-Comté, 2006, explained that the holes produced for SAW devices are etched with an apex half-angle of about 20° (therefore a 70° slope in the material). This angle leads to surface wave losses in the substrate, and therefore poses a problem. The literature on phononic crystals in thin films does not report the etching angle of the inclusions, but it is generally accepted that this parameter represents a drawback, by analogy with SAW (surface acoustic wave) systems.

One of the important parameters in the field of phononic crystals is the frequency width of the bandgap. It is generally sought to obtain the largest possible bandgaps. It is often possible to widen the bandgap by increasing the diameter of the inclusions, as described in the article by S. Mohammadi, A. A. Eftekhar, A. Khelif, H. Moubchir, R. Westafer, W. D. Hunt and A. Adibi, *Complete phononic bandgaps and bandgap maps in two-dimensional silicon phononic crystal plates*, Electronic Letters, Vol. 43 (16), pp. 898-899, 2007 (i.e. increasing the parameter d/a, as shown schematically in FIG. 1), but technological limits are rapidly reached. This is because the practical production of devices does not allow dimensions of any size to be produced. Reducing the size leads to complicating the technological steps, and consequently a cost increase.

Another solution for producing AlN phononic crystals has also been proposed by Professor Piazza's team. Specifically, this team proposes AlN inclusions in an air matrix, these inclusions being connected together by "bridges". This solution remains complex as it requires the thickness of the "bridges" to be properly controlled (N. K. Kuo, C. Zuo and G. Piazza, *Microscale inverse acoustic bandgap structure in aluminum nitride*, Applied Physics Letters, 95, No. 093501, September 2009; N. K. Kuo, C. Zuo and G. Piazza, *Demonstration of inverse acoustic bandgap structures in AlN and integration with piezoelectric contour mode wideband transducers*, IEEE, 2009).

SUMMARY OF THE INVENTION

In this context, the present invention proposes a solution for controlling, or even widening, the frequency bandgaps obtained for phononic crystals. Indeed, the applicant has demonstrated that the bandgap width is greater for example for conical holes in comparison with cylindrical holes, thereby making it possible to obtain wider frequency bandgaps, while maintaining technologically achievable geometries and thus making it possible to envisage novel applications or fabrication cost reductions.

More precisely, the subject of the present invention is a process for producing an acoustic device having a phononic crystal structure comprising a first series of inclusions produced in a first medium that are distributed in a matrix consisting of a second medium, making it possible to block the propagation of acoustic waves within a frequency band, namely within the bandgap, characterized in that it comprises the following steps:

a step of defining the geometric parameters of said inclusions, said inclusions having walls in contact with said matrix, making at least one non-zero first angle θ, called the wall angle, to the normal of the plane of said structure, said geometric parameters including said first wall angle, said step comprising:

the determination of a function relating to the variation in frequency position of said bandgap with said wall angle and/or the determination of a function relating to the variation in width of said bandgap with said wall angle; and the determination of said at least first angle θ, for a selected frequency position and/or selected width of the bandgap, from the function or functions determined beforehand; and a step of producing said first series of inclusions having at least said first wall angle in said matrix formed by said second medium.

According to one embodiment of the invention, the step of determining a function is formed by a 3D simulation operation carried out by finite element analysis and/or by experimental measurement.

According to one embodiment of the invention, the process comprises the following steps:
the deposition of a layer of AlN material on a substrate;
the production of a resist mask on the layer of AlN material;
an etching operation, which may be a dry etching operation, so as to define conical holes, having at least said first wall angle, in the layer of AlN material; and
removal of the resist mask.

According to one embodiment of the invention, the dry etching operation is an RIE (reactive ion etching) operation.

According to one embodiment of the invention, the process comprises, on an SOI substrate consisting of a top silicon layer on the surface of a silicon oxide layer:
the deposition of a resist on the surface of the SOI substrate;
the definition of etched features in said resist layer;
a step of making said resist flow, so as to orient the etching features;
an operation of etching the top silicon layer through said oriented features in said resist so as to define conical holes having at least said first wall angle; and
the removal of said resist layer with etching features.

According to one embodiment of the invention, the inclusions have cross-sectional geometries of the circular or square or hexagonal or triangular type.

According to one embodiment of the invention, the phononic crystal structure has a periodic organization, the series of inclusions being distributed periodically in the matrix.

According to one embodiment of the invention, the inclusions are placed in periodic arrangements obtained by repetition of an elementary lattice cell of the hexagonal or square or triangular or honeycomb type.

According to one embodiment of the invention, the inclusions are what are called closed cones, so as to enlarge the bandgap to the maximum possible.

According to one embodiment of the invention, when the inclusions have several wall angles, this process includes a step of defining the geometric parameters of said inclusions, comprising: the determination of a function relating to the variation in the frequency position of said bandgap with said wall angles and/or the determination of a function relating to the variation in width of said bandgap with said wall angles.

According to one embodiment of the invention, the inclusions are produced in a heterogeneous matrix possibly comprising a multilayer stack.

According to one embodiment of the invention, the inclusions of a series are formed respectively by several superposed and/or juxtaposed materials.

According to one embodiment of the invention, said structure has several series of different inclusions.

According to one embodiment of the invention, said structure has several series of inclusions produced respectively in different matrices.

According to one embodiment of the invention, the inclusions are holes.

According to one embodiment of the invention, the inclusions consist of holes partially or completely filled with material.

According to one embodiment of the invention, the process further includes the production of a Bragg mirror structure supporting said phononic structure.

According to one embodiment of the invention, the phononic structure is a two-dimensional periodic structure.

According to one embodiment of the invention, the two-dimensional phononic crystal of said structure has a thickness of the same order of magnitude as the lattice parameter of the crystal.

BRIEF DESCRIPTION OF THE DRAWINGS

The invention will be better understood and other advantages will become apparent on reading the following description given by way of non-limiting example and illustrated by the appended figures, in which.

DETAILED DESCRIPTION

In general, the process of the present invention makes it possible to produce an acoustic device according to the invention having a preferably two-dimensional phononic structure comprising usually periodic features such that they enable the bandgaps of the phononic crystal structure to be controlled or even widened.

When a two-dimensional phononic crystal has a small thickness, of the same order of magnitude as the lattice parameter, it may also be called a structure having 2.5 dimensions.

The present invention may relate to structures on thin films composed of two different materials, but the principle is also applicable to more complex two-dimensional structures (bulk structures: phononic crystals on the surface of a substrate, or on a Bragg mirror, or structures having more than two materials). In all cases acoustic waves are involved, whether these be bulk waves (BAW) or plate waves (Lamb waves).

Figure 1:
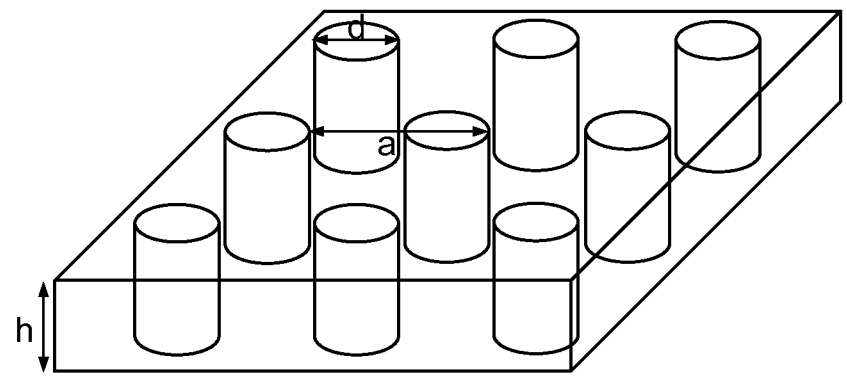
FIG. 1 shows schematically a 2D phononic crystal structure according to the known art.
Figure 2:
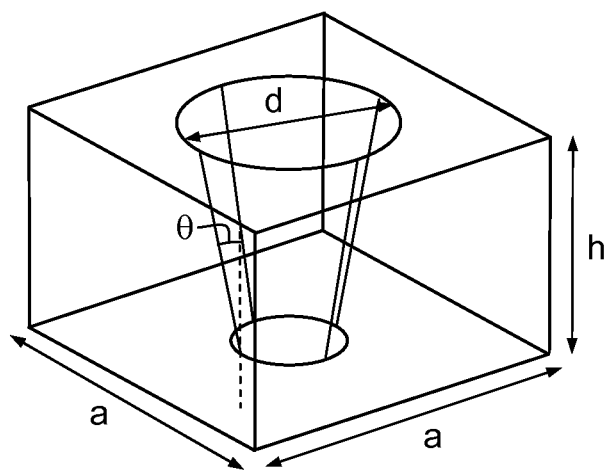
FIG. 2 illustrates an example of a crystal lattice cell in a phononic crystal structure according to the invention.

FIG. 2 illustrates an example of a periodic feature that may be advantageously used in a phononic crystal of an acoustic device according to the invention, the angle θ corresponding to what is called the wall angle and the inclusion in the present case being holes.

The applicant has found that the higher the angle θ, defined relative to the normal to the plane of the structure, the wider the bandgap. This effect is counteracted by the fact that, if the angle is too high, the holes close up, and therefore the bandgap is also progressively closed up.

Increasing the angle θ also has the effect of increasing the central frequency of the bandgap, up to the point when the bandgap is completely closed up.

The applicant has thus overturned a preconception. This is because, according to the published prior art, the fact of producing cones is considered to be a fabrication defect as described notably in the articles by S. Mohammadi, A. A. Eftekhar, A. Khelif, H. Moubchir, R. Westafer, W. D. Hunt and A. Adibi, *Complete phononic bandgaps and bandgap maps in two-dimensional silicon phononic crystal plates*, Electronic Letters, Vol. 43(16), pp. 898-899, 2007; R. H. Olsson, I. F. El-Kady, M. F. Su, M. R. Tuck and J. G. Fleming, *Microfabricated VHF acoustic crystal and waveguides*, Sensors and Actuators, 145-146, Issue SI, pp. 87-94, November 2008; and S. Mohammadi, A. A. Eftekhar, A. Khelif, W. Hunt and A. Adibi, *Evidence of large high frequency complete phononic bandgaps in silicon phononic crystal plates*, Applied Physics Letters, 92, Issue 22, 221905, June 2008.

The present invention therefore goes against this tendency: to obtain a wide bandgap, it is necessary to have a structure with periodic holes, for example of conical shape, the optimum being obtained with an internal angle allowing the holes to be closed up, i.e. angles within a range from 15° to 85°.

The angles may be intentionally chosen not to be the optimum angle, but an intermediate angle so as to have a defined bandgap width. In this case, the relationship between the angle of the inclusions and the bandgap width as a function of the arrangement, shape and size of the inclusions and the materials used is calculated.

Thus, according to the example illustrated in FIG. 2, the phononic crystal structure has inclusions formed by holes of circular cross section, the constituent medium of the inclusions being for example air in a solid matrix and these holes being organized in a square lattice.

According to other embodiments, the phononic crystal structure may comprise:
  inclusions of various cross sections: circular, square, hexagonal, triangular, etc.,
  inclusions in a heterogeneous matrix (for example in a membrane composed of two layers, notably a $SiO_2$ layer and an AlN layer);
  inclusions having several angles, either in the same material or in several different materials;
  holes filled with materials, whether partially or entirely (as described in the article by R. H. Olsson, I. F. El-Kady, M. F. Su, M. R. Tuck and J. G. Fleming, *Microfabricated VHF acoustic crystal and waveguides*, Sensors & Actuators, 145-146, Issue SI, pp. 87-94, November 2008);
  solid inclusions in a fluid matrix (such as air), which are connected together by "bridges" (as described in the articles by N. K. Kuo, C. Zuo and G. Piazza, *Microscale inverse acoustic bandgap structure in aluminum nitride*, Applied Physics Letters, 95, 093501, September 2009, and *Demonstration of inverse acoustic bandgap structures in AlN and integration with piezoelectric contour mode wideband transducers*, IEEE, 2009).

All these phononic crystal structures may be fabricated in membrane form or on a substrate (Bragg mirror or directly on a substrate) in order to produce an acoustic device according to the present invention.

First Example of a Phononic Structure that can be Used in an Acoustic Device of the Invention:

This example of a structure comprises a phononic crystal in 2.5 dimensions, formed from holes constituting the inclusions, in an aluminium nitride (AlN) membrane and these holes being in a square periodic arrangement.

The geometry of the holes is defined by the following parameter ratios: d/a=0.8 and h/a=0.6.

Figure 3:
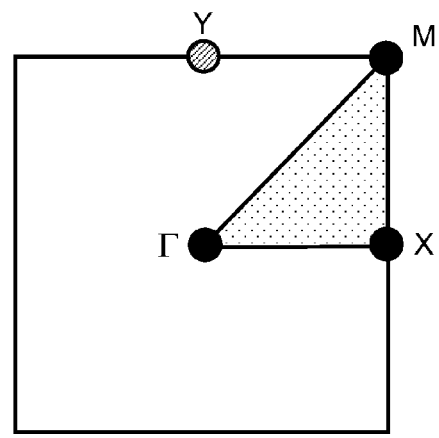
FIG. 3 illustrates a reduced Brillouin zone for a square lattice cell.

With such a hole geometry, the applicant has determined, by 3D simulation performed by finite element analysis using Comsol Multiphysics® commercial software, the bandgaps of this type of phononic structure, according to a method given in the article by M. Gorisse, A. Reinhardt, E. Defaÿ and M. Aïd, *Conception de cristaux phononiques 2D dans une membrane de nitrure d'aluminium* [Design of 2D phononic crystals in an aluminium nitride membrane], Journées Nationales du Réseau Doctoral en Microélectronique, June 2010, Montpellier, France, and focused on bandgaps for waves propagating along the ΓX direction of the reduced Brillouin zone for a square lattice cell, as illustrated in FIG. 3.

In a first step, to determine the properties of such a structure, the applicant also analyzed a phononic crystal consisting of cylindrical holes drilled in an aluminium membrane, with the following dimensions chosen:
  d/a=0.8
  h/a=0.6
  θ=0°

With these dimensions, a bandgap appears for normalized frequencies (i.e. frequencies multiplied by the lattice parameter a) of between 2200 and 2375 m/s.

Such a structure is suitable within the context of the present invention and the inclusions are formed by holes of particular geometry. To do so, the internal walls of the holes make a non-zero angle with the normal to the plane of said structure, thereby constituting conical holes.

Figure 4:
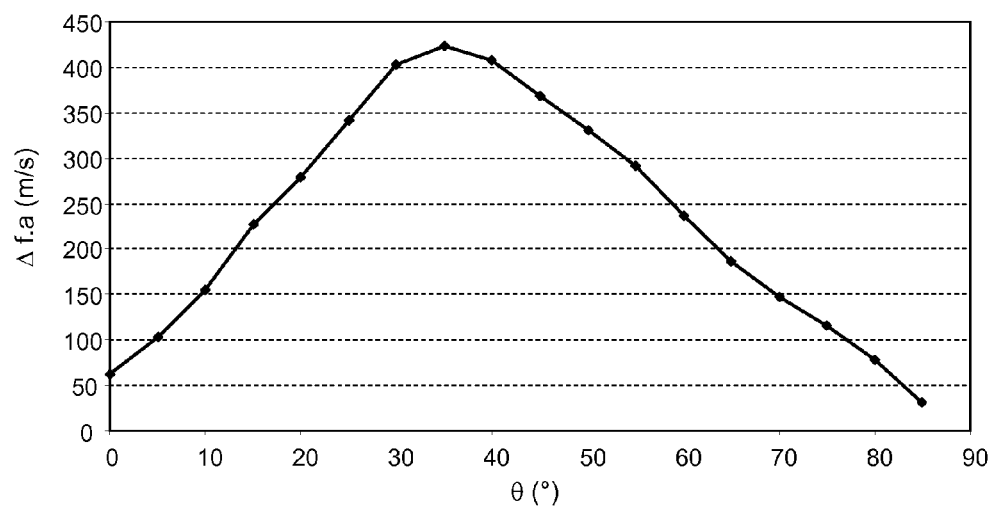
FIG. 4 illustrates the variation in width of the bandgap as a function of the internal cone angle in an example of a phononic structure according to the invention.
Figure 5:
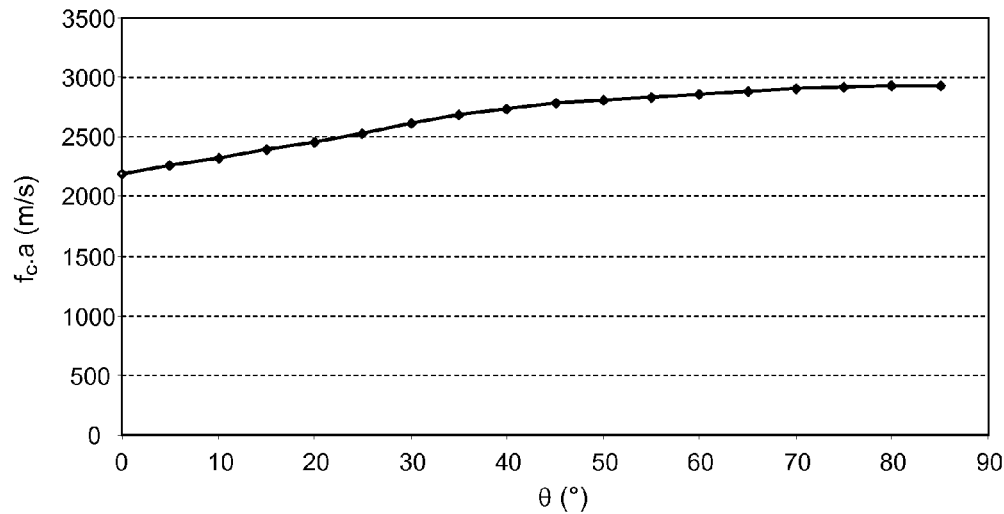
FIG. 5 illustrates the variation in the position of the bandgap as a function of the cone angle in an example of a phononic structure according to the invention.

FIGS. 4 and 5 illustrate for this purpose the width of the bandgap and the central frequency of said bandgap, these being plotted as a function of the wall angle of the conical holes.

These figures show that the bandgaps are wider and higher in frequency when the apex half-angle of the cones increases until reaching a maximum corresponding to a geometry in which the holes close up and thus correspond to an optimum for the bandgap width, for an angle of about 35°.

In addition, it appears that the bandgap is at increasingly higher frequency when θ is increased, without any distinction between emerging and non-emerging holes.

Figure 6:
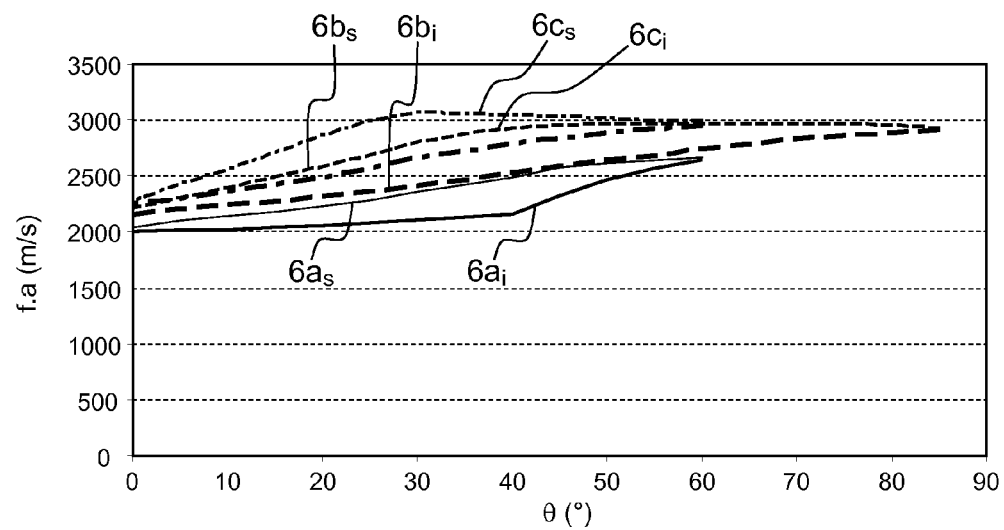
FIG. 6 illustrates the variation in the bandgap for various inclusion geometries according to the present invention.

FIG. 6 shows the high frequencies (curves $6a_s$, $6b_s$, $6c_s$) and the low frequencies (curves $6a_i$, $6b_i$, $6c_i$) of bandgaps for a d/a value of 0.8 and for various h/a values. All these geometries have the same type of curve: the higher the angle, the wider the bandgap, until reaching a maximum width at the angle for which the holes close up, and then the width rapidly decreases after this maximum.

To obtain a wide bandgap, there is therefore an optimum angle that depends on the materials present, on the arrangement of the holes and on the sizes produced. In the present example, with a phononic crystal consisting of holes drilled in an AlN membrane, with a square arrangement, taking d/a=0.6 and h/a=0.8, the optimum angle is thus about 35° for the bandwidth.

The applicant has noticed that the conicity of the inclusions promotes mode conversion within the phononic crystal. This effect makes it possible for all the modes of the crystal to be excited more easily, thus avoiding undesirable phenomena acting on the transmission of the structure and which could falsify the effective properties of the crystal, for example those encountered in the article by Y. M. Soliman, M. F. Su, Z. C. Leseman, C. M. Reinke, I. El-Kady and R. H. Olsson III4, *Phononic crystals operating in the gigahertz range with extremely wide bandgaps*, Applied Physics Letters 97, 193502, 2010.

First Example of a Process for Fabricating an Acoustic Device According to the Invention:

The phononic crystal structure is produced in a suspended AlN membrane, but the suspended membrane could just as well be replaced with a thin film on the surface of a Bragg mirror structure or on a substrate directly.

Figure 7A:
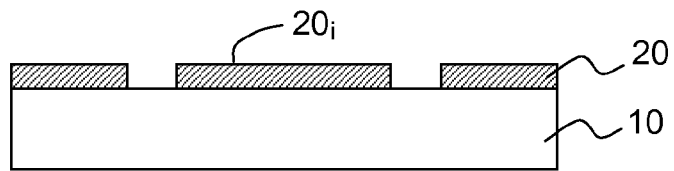
FIGS. 7a to 7d and 7e respectively illustrate the various steps of a first process for fabricating an example of an aluminium nitride phononic structure according to the invention and a top view of said structure thus obtained by the process using a wet etching step.

As illustrated in FIG. 7a, a film 20, intended for producing a first etching mask, is deposited on a substrate 10, which may typically be made of silicon. This may typically be a film of molybdenum with a thickness of about 0.3 μm, but it could also be a film of platinum or any other material enabling the AlN to be properly structured. The process continues with conventional steps—photolithography, dry etching and resist removal—in order for the first etching features 20, to be conventionally defined.

Figure 7B:
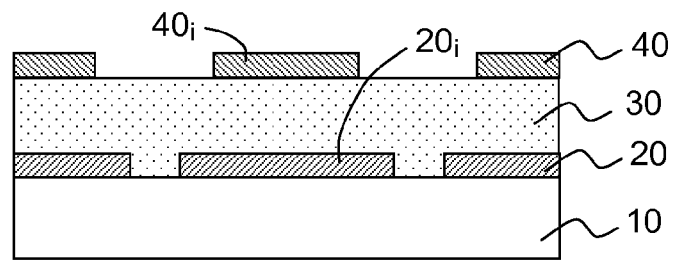

The process then continues with the deposition of a film 30 of aluminium nitride AlN with a thickness of about 0.3 μm followed by the deposition of a second film 40 intended to constitute a second etching mask, in which the second etching features 40, are defined by photolithography, dry etching and resist removal, as illustrated in FIG. 7b.

Figure 7C:
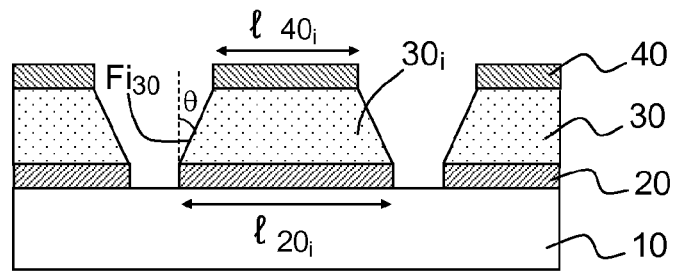

The process continues with an AlN wet etching step using, for example, a hot $H_3PO_4$ solution, as illustrated in FIG. 7c. It should be noted that, to obtain holes with sidewalls $Fi_{30}$ having a non-zero wall angle θ, the etching features $20_i$ and $40_i$ are intended to have different lateral dimensions $I_{20i}$ and $I_{40i}$.

Figure 7D:
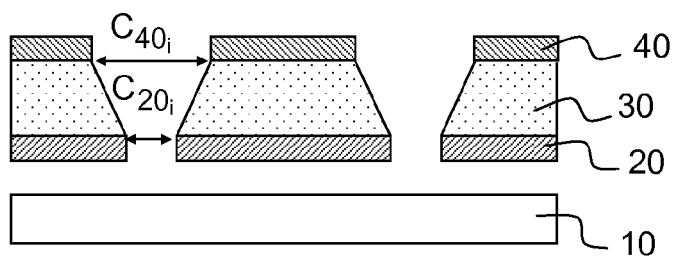

To free the membrane, the process concludes with the step of etching the silicon with xenon difluoride $XeF_2$, as illustrated in FIG. 7d.

Figure 7E:
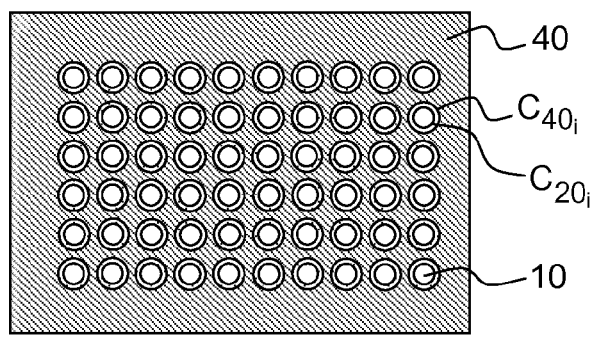

FIG. 7e illustrates a top view of the phononic structure thus obtained, indicating the double circumferences $C_{20i}$ and $C_{40i}$ due to the conicity of the holes.

The main advantage of this embodiment is that it enables any angle of less than about 30° to be achieved, this angle corresponding to an AlN crystal plane, chemical etching of which is extremely slow or virtually prevented. However, this type of process does not allow features of very small size (openings smaller than 10 μm) to be produced.

Second Example of a Process for Fabricating an Acoustic Device According to the Invention:

According to this second process, a dry etching method is used and no longer a wet etching method as described in the first example.

Figure 8A:
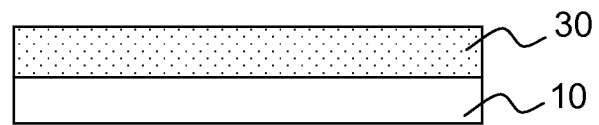
FIGS. 8a to 8d respectively illustrate the various steps of a second process for fabricating an example of an aluminium nitride phononic structure according to the invention obtained by said process using dry etching steps.

As illustrated in FIG. 8a, an aluminium nitride film 30 about 2 μm in thickness is deposited directly on a silicon substrate 10.

Figure 8B:
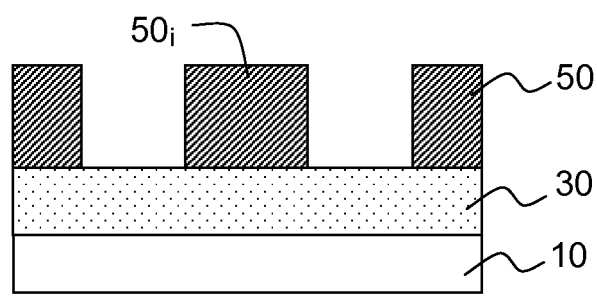

The process then continues with the deposition of a thick (about 4 μm) resist film 50 in which etching features 50, are defined, as illustrated in FIG. 8b.

Figure 8C:
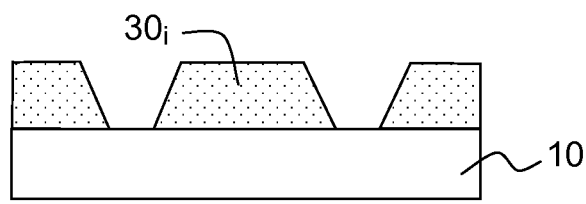
Figure 8D:
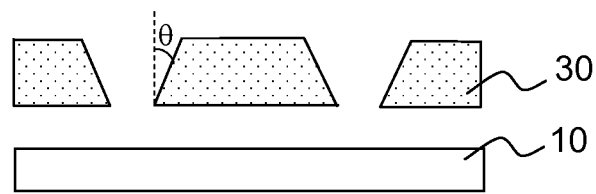

The process continues with a dry etching step, for example by RIE (reactive ion etching) so as to define the conical holes between the features $30_i$ and concluding with the removal of the thick resist film, as illustrated in FIG. 8c.

This process can be carried out on small holes (of the order of a micron in size) and makes it possible to target an optimum angle in the region of 30°. Above 30°, the etching reaches an AlN crystal plane and can no longer be carried out correctly.

In the case of dry etching, the etching angle is controlled by optimizing the process with a view to achieving etching selectivity between the resist mask and the film intended to be etched. This is accomplished by adjusting the proportions of the gas mixture injected into the etching reactor (for example the amount of oxygen), the pressure in the chamber and the acceleration voltages for the ions responsible for the etching. By virtue of this selectivity, any initial slope in the resist becomes transferred to the etched film homothetically (in a ratio corresponding precisely to the etching selectivity). The initial slope of the resist mask is itself controlled in two ways:

the faceting effect (usually a defect) may be used, whereby the corners of the resist mask are seen to be faceted during etching; or a slope may be deliberately forced in the resist features by heating the resist at a high temperature (for example, at 200° C. for 15 minutes) so as to make it flow.

A first variant of the etching process is illustrated in FIGS. 9a to 9f.

Figure 9A:
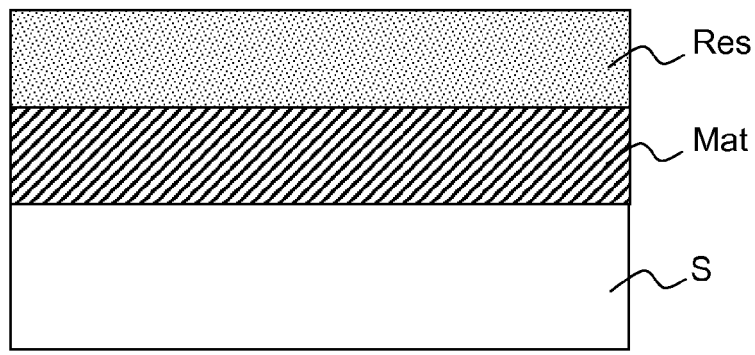
FIGS. 9a to 9f illustrate the various steps of a first process for controlling the etching slopes.

In a first step, a matrix Mat is produced on a substrate S, said matrix being covered with a resist film Res, as illustrated in FIG. 9a.

Figure 9B:
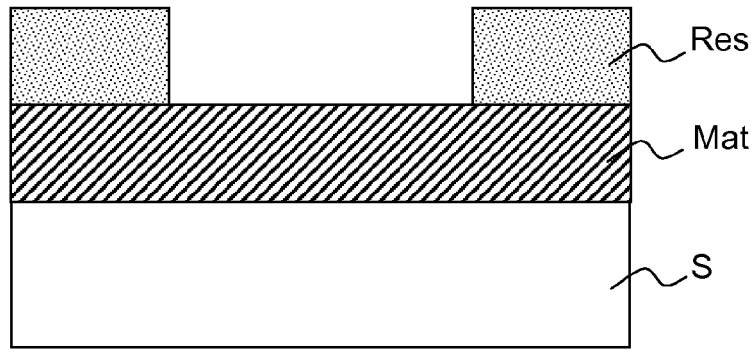

In a second step, a photolithography, exposure and development operation is carried out on the resist, as illustrated in FIG. 9b, after which the resist is annealed.

Figure 9C:
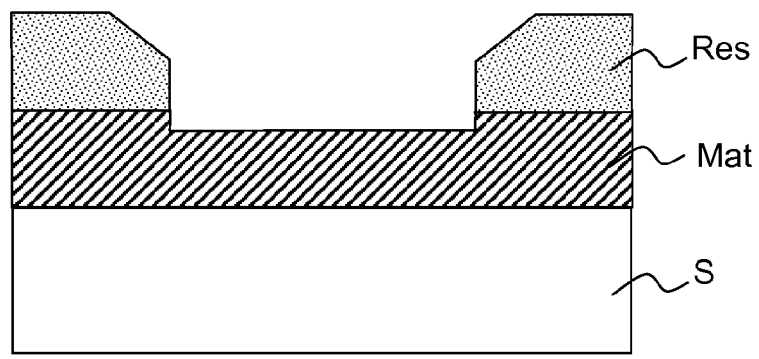

In a third step, the etching operation is started, beginning to facet the resist mask as illustrated in FIG. 9c.

Figure 9D:
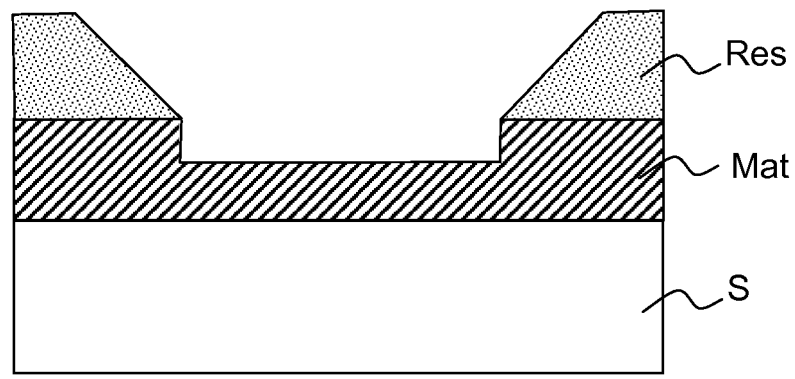

The etching operation is continued until the faceting is over the entire height of the resist mask, as illustrated in FIG. 9d.

Figure 9E:
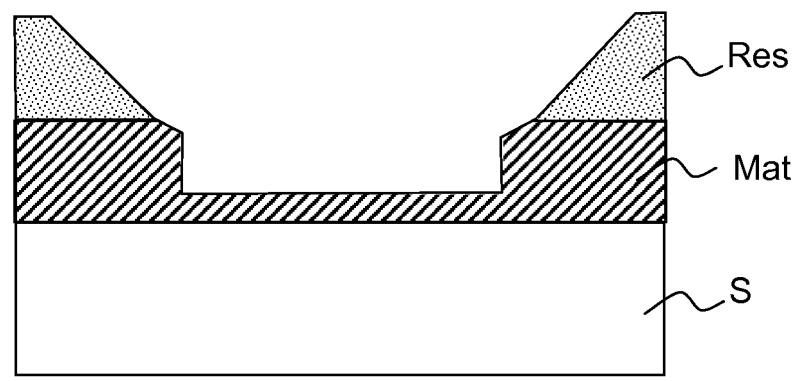

The slope of the resist is then transferred to the matrix film, as illustrated in FIG. 9e.

Figure 9F:
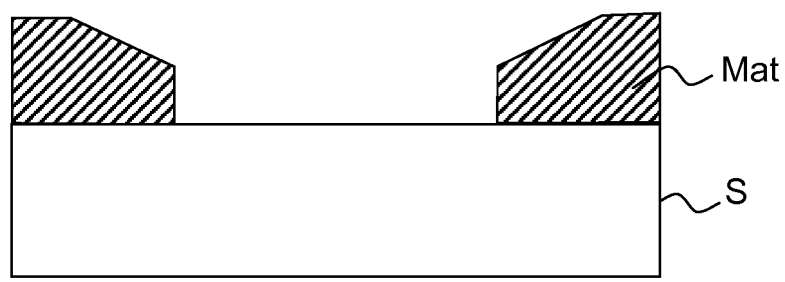

Next, the resist is removed at the end of etching, as illustrated in FIG. 9f, the etched matrix being left bare on the substrate.

Figure 10A:
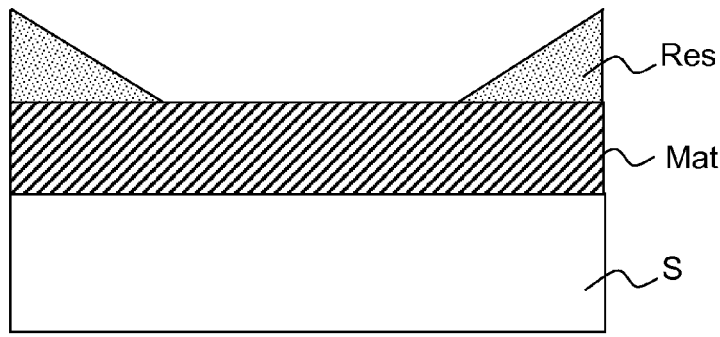
FIGS. 10a to 10c illustrate the various steps of a second process for controlling the etching slopes.
Figure 10B:
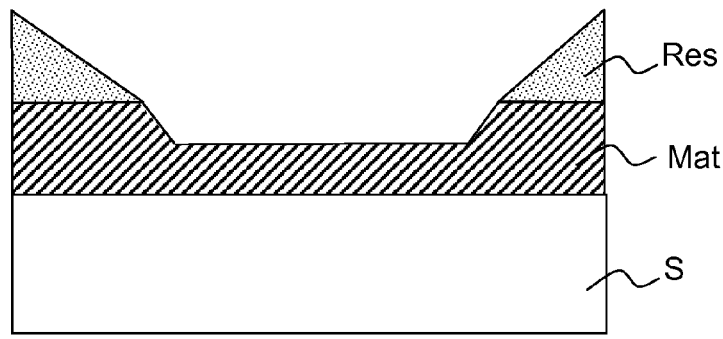
Figure 10C:
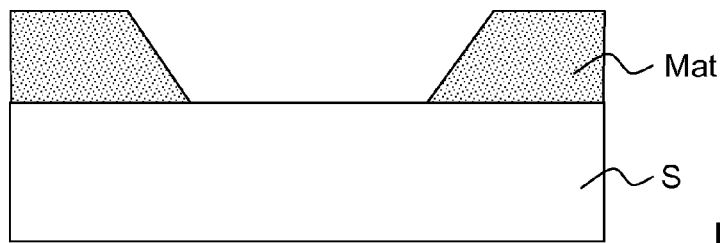

According to a second, better controlled, variant, the resist is made to flow, as illustrated in FIGS. 10a and 10c.

In a first step, the resist Res is made to flow for example at 200° C. for about 15 minutes, as illustrated in FIG. 10a, onto the surface of the matrix film Mat on the surface of the substrate S.

During the etching step, the slope of the resist is transferred to the matrix film, as illustrated in FIG. 10b.

The resist is then removed at the end of etching, as illustrated in FIG. 10c, so as to leave the etched matrix bare.

Similar results may be obtained using a hard mask instead of a resist mask. In this case, an additional film (for example of $SiO_2$ or $Si_3N_4$), which has an etching selectivity with respect to AlN, is deposited. This additional film is patterned by lithography (aiming for the desired angle), etching and then stripping. The AlN is then etched, transferring the angle, after which the hard mask is removed by another etching step.

Figure 11:
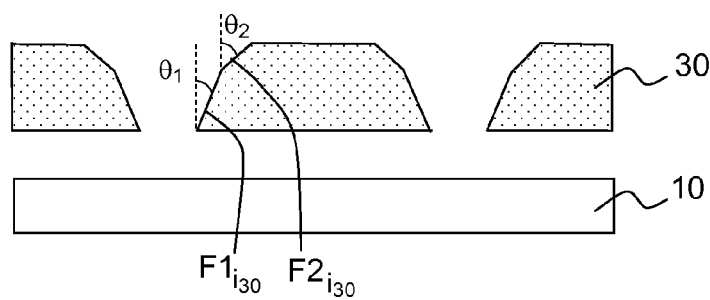
FIG. 11 illustrates an embodiment of the invention in which the features have several wall angles.

A variant of the above process as described in FIGS. 8a to 8d is illustrated in FIG. 11, which consists in successively etching holes with several wall angles $θ_1$ and $θ_2$, defining several sidewalls $F1_{i30}$ and $F2_{i30}$, by successively adjusting different etching parameters.

Third Example of a Process for Fabricating an Acoustic Device According to the Invention:

According to this example, the phononic structure is produced directly in an SOI substrate.

Figure 12A:
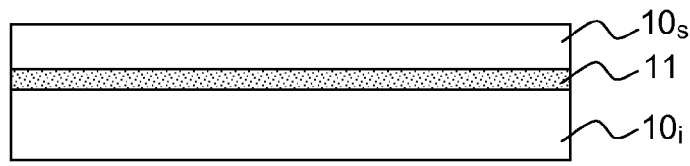
FIGS. 12a to 12f illustrate the various steps of a second process for fabricating an example of a phononic structure produced in an SOI substrate.

To do so, and as illustrated in FIG. 12a, an SOI substrate 10 is used that includes an $SiO_2$ film 11, thus separating the substrate into two silicon portions $10_i$ and $10_s$.

Figure 12B:
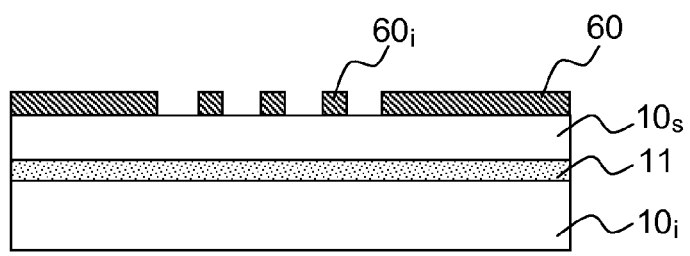

The process then continues with the deposition of a resist film 60 then with resist lithography and etching operations so as to define resist features 60$_i$ for the etching operation, as shown in FIG. 12b.

Figure 12C:
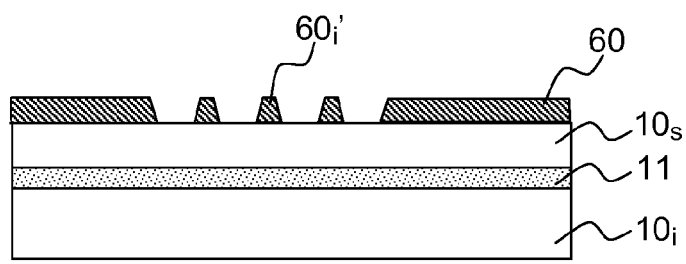

The process then continues with a step in which the resist is made to flow by heating it, so as to slant the sidewalls of the etching features and thus obtain modified etching features 60$_i$' with oblique sidewalls, as illustrated in FIG. 12c.

Figure 12D:
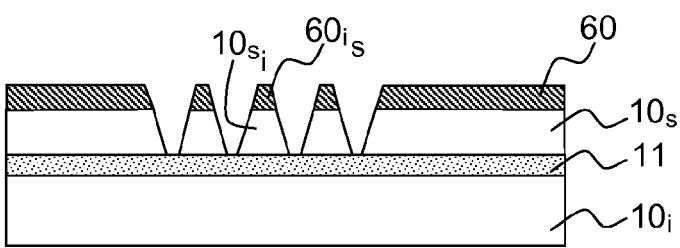

The silicon is thus etched through said modified features 60$_i$', as illustrated in FIG. 12d, so as to form the conical holes of the phononic structure thus produced between silicon features 10$_s$.

Figure 12E:
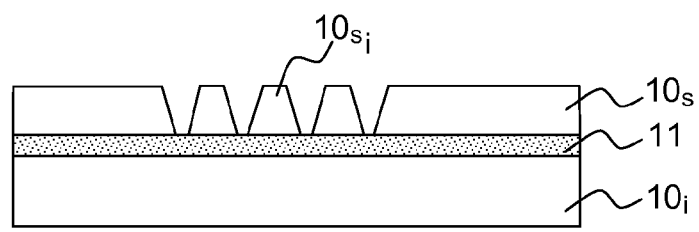

The resist is then removed, as illustrated in FIG. 12e.

Figure 12F:
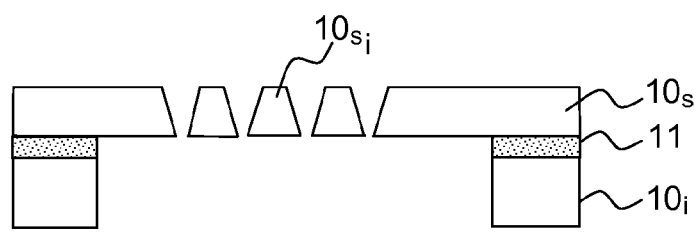

Next, the structure is freed so as to produce the membrane, by deep backside etching of the silicon, as illustrated in FIG. 12f.

The invention claimed is:

1. A process for producing an acoustic device having a phononic crystal structure comprising a first series of inclusions produced in a first medium that are distributed in a matrix comprising a second medium, making it possible to block propagation of acoustic waves within a frequency band, namely within the bandgap, comprising the following steps:
    defining geometric parameters of said inclusions, said inclusions having walls in contact with said matrix, making at least one non-zero first wall angle, to the normal of the plane of said structure, said geometric parameters including said first wall angle,
    said defining step comprising:
    determining at least any one of a function relating to the variation in frequency position of said bandgap with said first wall angle and a function relating to the variation in width of said bandgap with said first wall angle; and
    determining said first wall angle ($\theta$), for at least any one of a selected frequency position and a selected width of the bandgap, from the function or functions determined beforehand; and
    producing said first series of inclusions having at least said first wall angle in said matrix formed by said second medium.

2. A process for producing an acoustic device having a phononic crystal structure according to claim 1, wherein the step of determining a function is formed by a 3D simulation operation carried out by finite element analysis and/or by experimental measurement.

3. A process for producing an acoustic device having a phononic crystal structure according to claim 1, wherein the step of producing said first series of inclusions comprises:
    deposition of a layer of AlN material on a substrate;
    production of a resist mask on the layer of AlN material;
    an etching operation, which may be a dry etching operation, so as to define conical holes, having at least said first wall angle, in the layer of AlN material; and
    removal of the resist mask.

4. A process for producing an acoustic device having a phononic crystal structure according to claim 3, wherein the dry etching operation is an RIE operation.

5. A process for producing an acoustic device having a phononic crystal structure according to claim 1, further comprising, on an SOI substrate comprising a top silicon layer on the surface of a silicon oxide layer, the steps of:
    deposition of a resist on the surface of the SOI substrate;
    definition of etched features in said resist layer;
    making said resist flow, so as to orient the etching features;
    etching the top silicon layer through said oriented features in said resist so as to define conical holes having at least said first wall angle; and
    removal of said resist with etching features.

6. A process for producing an acoustic device according to claim 1, wherein the inclusions have cross-sectional geometries of the circular or square or hexagonal or triangular type.

7. A process for producing an acoustic device having a phononic crystal structure according to claim 1, further comprising
    producing the series of inclusions periodically distributed in the matrix,
    wherein the phonic crystal structure has a periodic organization.

8. A process for producing an acoustic device having a phononic crystal structure according to claim 7, further comprising
    producing the inclusions in periodic arrangements by repetition of an elementary lattice cell of the hexagonal or square or triangular or honeycomb type.

9. A process for producing an acoustic device having a phononic crystal structure according to claim 1, wherein the inclusions have closed cones so as to enlarge the bandgap to the maximum possible.

10. A process for producing an acoustic device having a phononic crystal structure according to claim 1, wherein when the inclusions have a plurality of wall angles, and wherein the defining the geometric parameters of said inclusions further comprises carrying out at least any one of:
    determining variation in frequency position of said bandgap as a function of the plurality of wall angles, and
    determining variation in width of said bandgap as a function of the plurality of wall angles.

11. A process for producing an acoustic device having a phononic crystal structure according to claim 1, further comprising
    producing the inclusions in a heterogeneous matrix comprising a multilayer stack.

12. A process for producing an acoustic device having a phononic crystal structure according to claim 1, further comprising
    forming the inclusions by at least any of superposed materials, juxtaposed materials, and superposed and juxtaposed materials.

13. A process for producing an acoustic device having a phononic crystal structure according to claim 1, wherein the said structure comprises different inclusions.

14. A process for producing an acoustic device having a phononic crystal structure according to claim 1, wherein said structure comprises inclusions produced in different matrices.

15. A process for producing an acoustic device having a phononic crystal structure according to claim 1, wherein the inclusions are holes.

16. A process for producing an acoustic device having a phononic crystal structure according to claim 15, wherein the inclusions consist of holes partially or completely filled with material.

17. A process for producing an acoustic device having a phononic crystal structure according to claim 1, further including the production of a Bragg mirror structure supporting said phononic structure.

18. A process for producing an acoustic device having a phononic crystal structure according to claim 1, wherein the phononic structure is a two-dimensional periodic structure.

19. A process for producing an acoustic device having a phononic crystal structure according to claim 18, wherein the two-dimensional phononic crystal of said structure has a thickness of the same order of magnitude as the lattice parameter of the crystal.

\* \* \* \* \*